United States Patent [19]
Mizuta

[11] Patent Number: 5,965,943
[45] Date of Patent: *Oct. 12, 1999

[54] SEMICONDUCTOR DEVICE WITH BONDING PAD ELECTRODE

[75] Inventor: Masaharu Mizuta, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/055,295

[22] Filed: Apr. 6, 1998

[30] Foreign Application Priority Data

Oct. 1, 1997 [JP] Japan ................................ 9-268548

[51] Int. Cl.⁶ .................................................. H01L 23/48
[52] U.S. Cl. ......................... 257/763; 257/765; 257/764; 438/612
[58] Field of Search .................................... 257/637, 751, 257/785, 295, 296, 763, 765, 771, 764; 438/396, 3, 612

[56] References Cited

U.S. PATENT DOCUMENTS 5,510,651  4/1996  Maniar et al. ........................ 257/295
5,525,546  6/1996  Harada et al. ........................ 438/612
5,554,866  9/1996  Nishioka et al. ..................... 257/295

FOREIGN PATENT DOCUMENTS

| 56-119377 | 9/1981 | Japan . |
| 57-146340 | 9/1982 | Japan . |
| 60-35552 | 2/1985 | Japan . |
| 61-82440 | 4/1986 | Japan . |
| 62-4352 | 1/1987 | Japan . |
| 62-120037 | 6/1987 | Japan . |
| 63-51649 | 3/1988 | Japan . |
| 4-351968 | 12/1992 | Japan . |
| 6-37139 | 2/1994 | Japan . |
| 7-244074 | 9/1995 | Japan . |
| 3025108 | 3/1996 | Japan . |

*Primary Examiner*—Tom Thomas
*Assistant Examiner*—Luan Thai
*Attorney, Agent, or Firm*—McDermott, Will & Emery

[57] ABSTRACT

A semiconductor device is provided to ensure electrical connection with a probe needle and also provide ready maintenance of the probe needle. The semiconductor device includes a silicon substrate, a bonding pad electrode layer formed on the silicon substrate, and a rhenium layer formed on the bonding pad electrode layer.

2 Claims, 7 Drawing Sheets

SEMICONDUCTOR DEVICE WITH BONDING PAD ELECTRODE

BACKGROUND OF THE INVENTION

1. Field of the Invention

The present invention relates to a semiconductor device, and particularly to a semiconductor device with a bonding pad electrode layer for inputting and outputting electrical signals to and from the external.

2. Description of the Background Art

In the processes for manufacturing semiconductor devices, a device referred to as a probe card has been conventionally used to inspect electrical characteristics of the semiconductor devices. FIG. 9 is a cross section illustrating a conventional probe card. The conventional probe card shown in FIG. 9 has an opening 114 formed approximately at the center of a substrate 113. Provided around opening 114 are a plurality of probe needles 115 of tungsten (W) towards the center of opening 114. Probe needle 115 is connected via a wiring to a terminal (not shown) arranged at a periphery of substrate 113. In inspection, the terminal is connected to an inspection device referred to as a prober.

The probe card is opposed to a surface of a semiconductor device subject to inspection and is arranged to allow the tip of probe needle 115 to come in contact with a bonding pad electrode formed on the surface of the semiconductor device. In inspecting electrical characteristics of the semiconductor device, probe needle 115 is brought into contact with the bonding pad electrode formed on the surface of the semiconductor device.

A description will now be provided as to how a probe needle comes into contact with a bonding pad electrode of a semiconductor device in the inspection.

FIG. 10 is a cross section of a bonding pad electrode of a conventional semiconductor device. The semiconductor device shown in FIG. 10 has a bonding pad electrode 102 of aluminum formed on a silicon substrate 101. An $SiO_2$-formed protection film 103 is formed to cover silicon substrate 101 and a portion of the upper surface and the side surface of bonding pad electrode 102. Formed on $SiO_2$-formed protection film 103 is a polyimide protection film 104. A contact hole 107 reaching bonding pad electrode 102 is formed in polyimide protection film 104 and $SiO_2$-formed protection film 103. On a surface of bonding pad electrode 102, aluminum is oxidized and aluminum oxide 106 is thus formed.

FIGS. 11 and 12 are schematic views for illustrating a contact between a probe needle and a bonding pad electrode of a semiconductor device subject to inspection in inspecting electrical characteristics of the semiconductor device. As shown in FIG. 11, when silicon substrate 101 (note that $SiO_2$-formed protection film 103 and polyimide protection film 104 shown in FIG. 10 are omitted in FIGS. 11 and 12) is raised, aluminum oxide 106 formed on a surface of bonding pad electrode 102 comes into contact with a tip 109 of a probe needle 108. Since aluminum oxide 106 is an insulator, a simple contact of tip 109 of the probe needle with aluminum oxide 106 does not result in electrical connection between tip 109 of the probe needle and bonding pad electrode 102.

Accordingly, silicon substrate 101 is further raised, as shown in FIG. 12. This allows the probe needle to be elastically deformed and tip 109 of the probe needle is moved in the horizontal direction. Thus, aluminum oxide 106 on the surface of bonding pad electrode 102 is exfoliated from the surface of bonding pad electrode 102 to allow direct contact between bonding pad electrode 102 and tip 109 of the probe needle so that the electrical characteristics of the semiconductor device can be inspected. Electrical characteristics of semiconductor devices can also be inspected in a similar procedure if bonding pad electrode 102 is formed of copper or tungsten.

When the aluminum oxide on the surface of bonding pad electrode 102 or the like is removed as described above, adhesion of the aluminum oxide to the tip of the probe needle or the like will increase contact resistance, which often results in an inaccurate measurement of electrical characteristics of the semiconductor device. Various approaches have been taken in order to solve this problem. For example, Japanese Patent Laying-Open No. 4-351968 and Japanese Utility Model Application No. 7-13364 (Registered Japanese Utility Model No. 3025108) proposed that a probe needle is formed of a material which is abrasion-resistant and to which less foreign matters adhere so that the probe needle has long life span and is less often subjected to unsatisfactory contacts, i.e., ensures electrical contact.

Japanese Patent Laying-Open Nos. 56-119377 and 7-244074 proposed that the tip of a probe needle to which foreign matters adhere is stuck several times into a resin parent material, such as an elastic silicon rubber mixed with a fines abrasive, such as whetstone, and the tip and side surface of the probe needle are thus scraped off to remove the aluminum oxide resulting in causing unsatisfactory contacts and thus achieve good electrical contact.

However, conventional methods of improving electrical contact are mainly related to probe card and probe needle, as described above, and it can be said that any approaches have hardly been made with respect to bonding pad electrode. Thus, conventional methods of improving electrical contact have not always sufficiently improved electrical contact. Furthermore, the conventional approaches have the disadvantage that the burden of maintenance of probe cards is increased.

SUMMARY OF THE INVENTION

The present invention is made to solve the problems described above, and contemplates a semiconductor device capable of improving the electrical contact between a probe needle and a bonding pad electrode by improving a bonding pad portion, and also significantly reducing the burden of probe card maintenance attributed to unsatisfactory contacts.

A semiconductor device according to the present invention includes a semiconductor substrate, a bonding pad electrode layer formed on the semiconductor substrate, and a rhenium layer formed on the bonding pad electrode layer.

In the semiconductor device thus structured, rhenium trioxide ($ReO_3$) resulting from oxidation of the rhenium layer on the bonding pad electrode layer, is conductive. Accordingly, the bonding pad electrode and a probe needle are electrically connected via the conductive rhenium layer and rhenium oxide and electrical contact of the probe needle will not be degraded. Furthermore, the crystal lattice of rhenium is hexagonal close-packed structure and is thus different from the crystal structure of tungsten forming the probe needle, i.e., body-centered cubic lattice. Thus, rhenium adheres to the probe needle less easily and formation of a rhenium layer on the bonding pad electrode can reduce the burden of maintenance, such as scraping off the tip of the probe needle.

Furthermore, the semiconductor device preferably has a barrier metal layer formed between the bonding pad electrode layer and the rhenium layer. In this example, a metal with good adhesion to both the bonding pad electrode layer and the rhenium layer, e.g., titanium nitride (TiN) can be used as the barrier metal layer to improve the adhesion between the bonding pad electrode layer and the rhenium layer.

Furthermore, the bonding pad electrode layer preferably contains aluminum. In this example, the bonding pad electrode layer can be readily formed by sputtering.

Furthermore, the bonding pad electrode layer can be readily formed by sputtering.

Furthermore, the bonding pad electrode layer preferably contains copper. In this example, electric resistance is further reduced and thus the bonding pad electrode layer can further be microfabricated.

Furthermore, the bonding pad electric layer preferably contains tungsten. In this example, the bonding pad electric layer can readily be formed by chemical vapor deposition (CVD).

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will now be described with reference to the drawings.

First Embodiment

Figure 1:
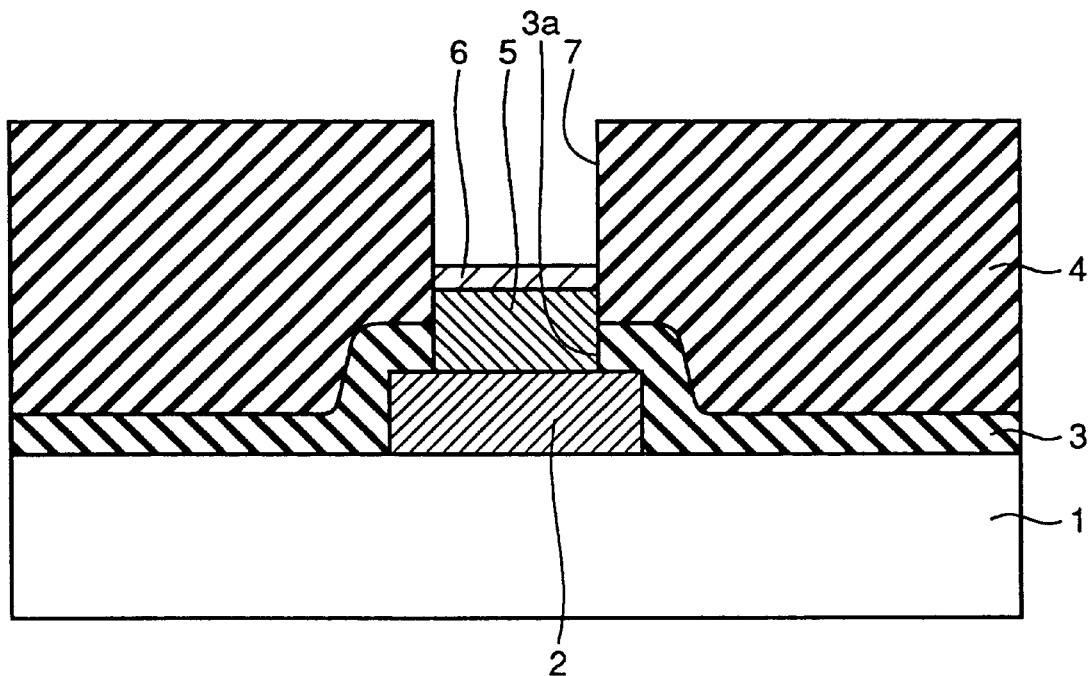
FIG. 1 is a cross section of a semiconductor device according to a first embodiment of the present invention.

Referring to FIG. 1, a semiconductor device includes a silicon substrate 1, a bonding pad electrode layer 2 and a rhenium layer 5.

Bonding pad electrode layer 2 is formed on silicon substrate 1. Bonding pad electrode layer 2 is formed of an aluminum alloy and is electrically connected to an interconnection layer (not shown) formed on silicon substrate 1.

Rhenium layer 5 is formed in contact with bonding pad electrode layer 2. The crystal lattice of rhenium layer 5 is hexagonal close-packed structure. A surface of rhenium layer 5 is oxidized by oxygen in the air and thin rhenium oxide 6 is thus formed. Rhenium oxide 6 may not be formed at the surface of rhenium layer 5, depending on the ambient. Rhenium oxide 6 is conductive.

An $SiO_2$-formed protection film 3 is formed to cover silicon substrate 1 and a portion of the upper surface and the side surface of bonding pad electrode layer 2. Formed on $SiO_2$-formed protection film 3 is a polyimide protection film 4 which has therein a contact hole 7 reaching rhenium oxide 6.

If rhenium oxide 6 is not formed at a surface of rhenium layer 5, a probe needle is brought into contact with rhenium layer 5 in testing the semiconductor device and an electrical signal is thus sent to the semiconductor device. If rhenium oxide 6 is formed at a surface of rhenium layer 5, the probe needle is brought into contact with a surface of rhenium oxide 6 at an electric signal is thus sent to the semiconductor device.

The semiconductor device thus configured can be tested regardless of oxidation of a surface of rhenium layer 5, since rhenium layer 5 and rhenium oxide 6 are conductive. More specifically, in contrast with conventional semiconductor devices, a high resistance material, such as aluminum oxide, is not produced at a portion with which a probe needle comes into contact and the electrical contact between the probe needle and the bonding pad electrode is improved.

Furthermore, since rhenium and rhenium oxide do not have body-centered cubic lattice, which is a crystal structure of tungsten forming the probe needle, less rhenium or rhenium oxide adheres to the probe needle. Accordingly, the life span of the probe needle is prolonged and the burden of maintenance, such as scraping off the tip and side surface of the probe needle, is reduced.

Since the semiconductor device improves the electrical contact between a probe needle and a bonding pad electrode, inadequatenesses in wafer testing are resolved and the cost of probe card maintenance and hence the cost of manufacturing the semiconductor device can be reduced. Furthermore, since rhenium is relatively cheaper than gold or the like, the cost of manufacturing the semiconductor device will not be increased if a rhenium layer is formed on the bonding pad electrode.

Figure 2:
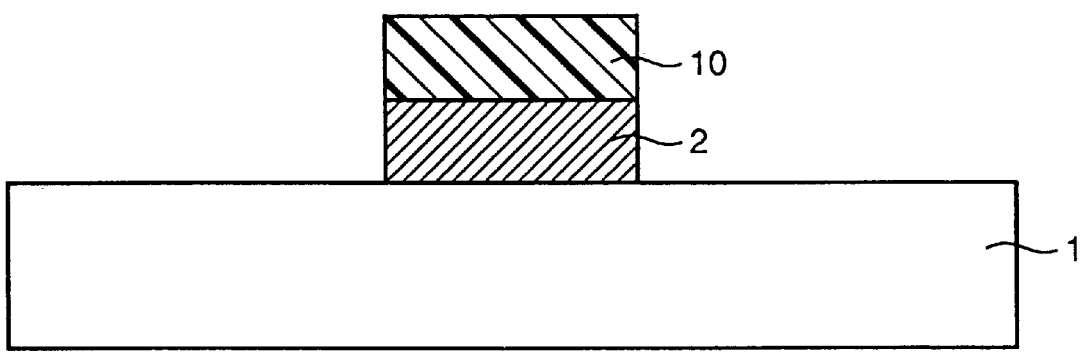
FIGS. 2–5 are cross sections showing first to fourth steps of a method of manufacturing the semiconductor device shown in FIG. 1, respectively.

A method of manufacturing the semiconductor device shown in FIG. 1 will now be described. Referring to FIG. 2, an aluminum layer is formed on a surface of silicon substrate 1 by sputtering. Resist is applied onto the aluminum layer and then patterned into a predetermined shape by photolithography to form a resist pattern 10. Then, resist pattern 10 is used as a mask to etch the aluminum layer to form bonding pad electrode 2. Resist pattern 10 is then removed.

Figure 3:
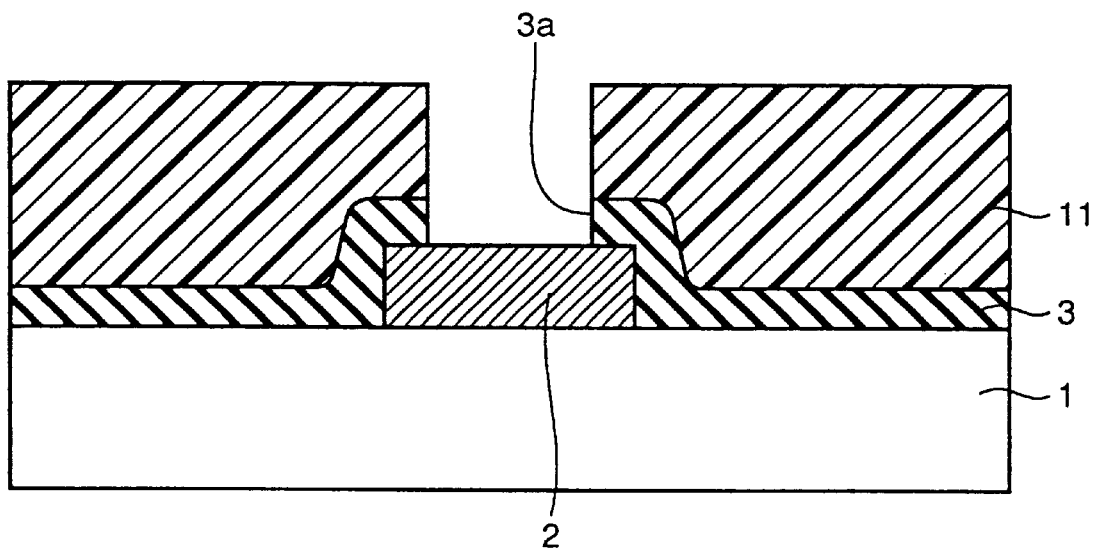

Referring to FIG. 3, $SiO_2$-formed protection film 3 is applied to cover silicon substrate 1 and bonding pad electrode 2. Resist is applied onto $SiO_2$-formed protection film 3 and then patterned into a predetermined shape by photolithography to form a resist pattern 11. $SiO_2$-formed protection film 3 is etched according to resist pattern 11 to form a hole 3a which reaches bonding pad electrode 2. Resist pattern 11 is then removed.

Figure 4:
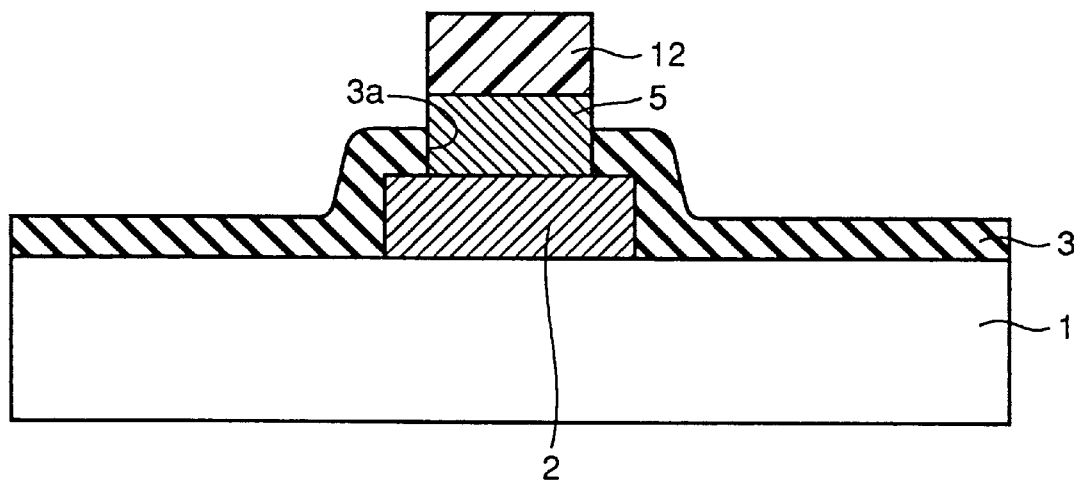

Referring to FIG. 4, rhenium is deposited by sputtering to cover $SiO_2$-formed protection film 3 and bonding pad electrode 2. Resist is applied onto the rhenium which is then patterned by photolithography to form a resist pattern 12. The rhenium is etched according to resist pattern 12 to form a rhenium layer 5 which is in contact with bonding pad electrode 2. Resist pattern 12 is then removed.

Figure 5:
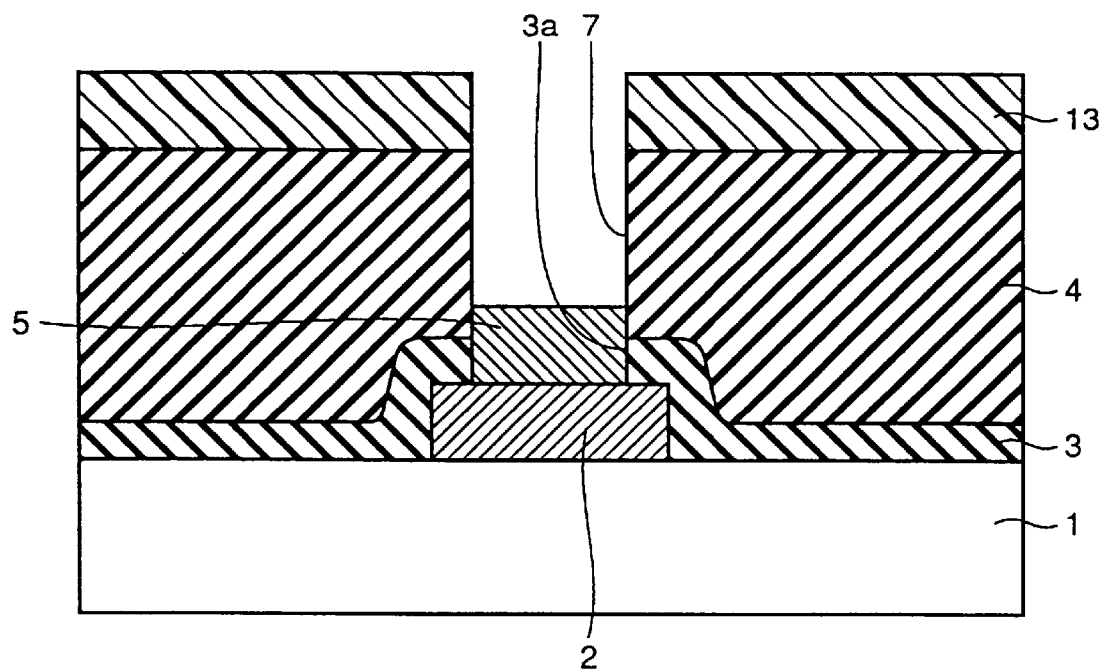

Referring to FIG. 5, polymide is applied onto silicon substrate 1 with N-methylpyrrolidone used as a solvent and the polyimide is then heated to approximately 400° C. to volatilize the solvent to form a polyimide protection film 4. Resist is applied onto polyimide protection film 4 and patterned into a predetermined shape by photolithography to form a resist pattern 13. Polyimide protection film 4 is etched according to resist pattern 13 to form a contact hole 7 which reaches rhenium layer 5. Finally, resist pattern 13 is removed to obtain the semiconductor device shown in FIG. 1.

Second Embodiment

Figure 6:
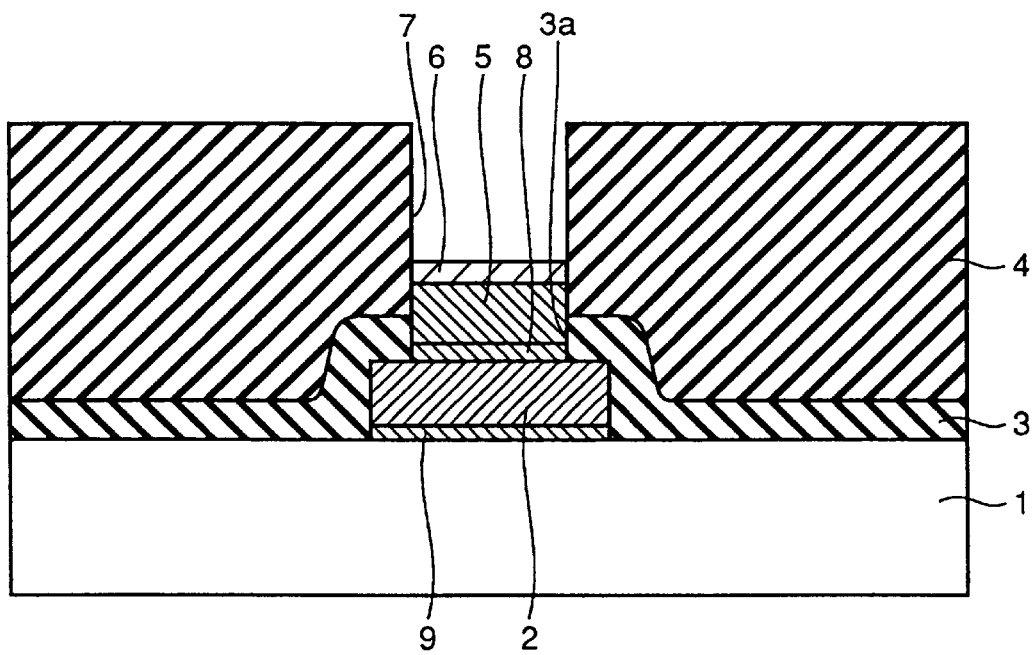
FIG. 6 is a cross section of a semiconductor device according to a second embodiment of the present invention.

The semiconductor device shown in FIG. 6 differs from that shown in FIG. 1 in that a barrier metal layer 9 formed of titanium nitride (TiN) is formed between bonding pad electrode 2 and silicon substrate 1 and that a barrier metal layer 8 formed of TiN is formed between bonding pad electrode 2 and rhenium layer 5. Rhenium oxide 6 may not be formed, depending on the ambient.

The semiconductor device shown in FIG. 6 thus configured has a similar effect to that shown in FIG. 1 according to the first embodiment. Furthermore, since titanium nitride, which has good adhesion to any of silicon substrate 1, bonding pad electrode layer 2 and rhenium layer 5, is used to form barrier metal layers therebetween, the adhesion therebetween can further be improved.

A method of manufacturing the semiconductor device shown in FIG. 6 will now be described.

Figure 7:
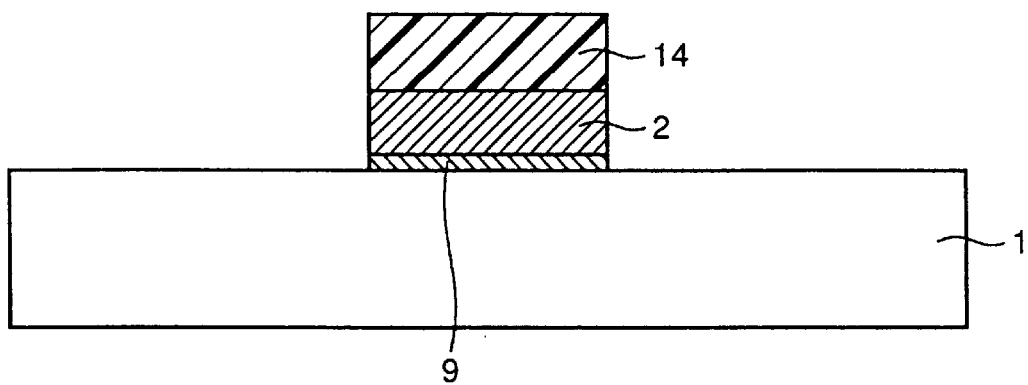
FIGS. 7 and 8 are cross sections showing first and second steps of a method of manufacturing the semiconductor device shown in FIG. 6, respectively.

Referring to FIG. 7, a titanium nitride layer is deposited on silicon substrate 1 by sputtering. An aluminum layer is deposited on the titanium nitride layer by sputtering. Resist is applied onto the aluminum layer and patterned into a predetermined shape by photolithography to form a resist pattern 14. The aluminum layer and the titanium nitride layer are patterned according to resist pattern 14 to form bonding pad electrode layer 2 and barrier metal layer 9. Resist pattern 14 is then removed.

Figure 8:
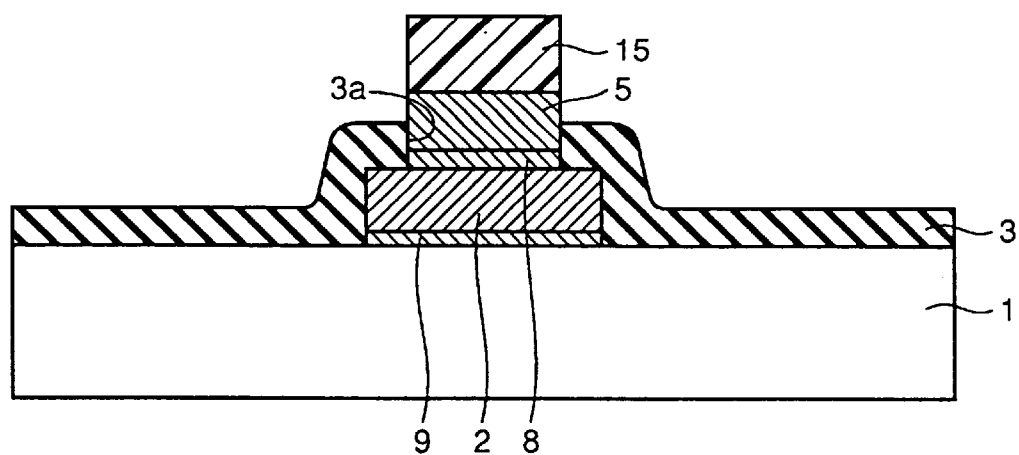
Figure 9:
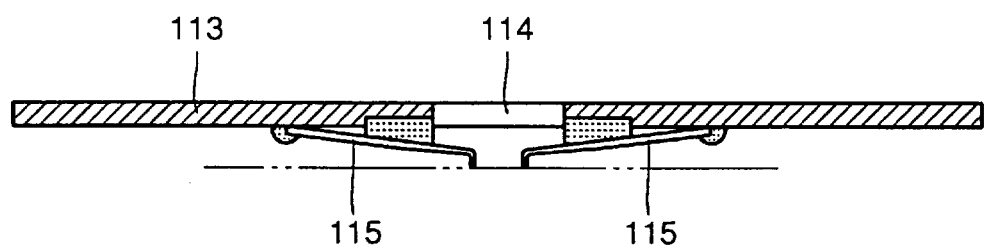
FIG. 9 is a cross section of a conventional probe card.
Figure 10:
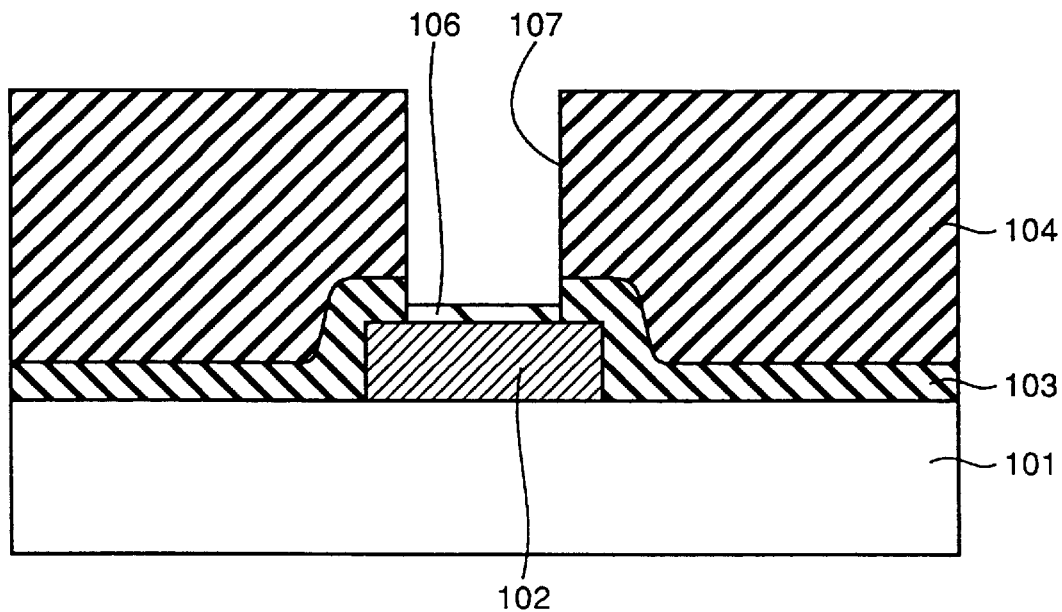
FIG. 10 is a cross section of a conventional semiconductor device contacting a probe needle.
Figure 11:
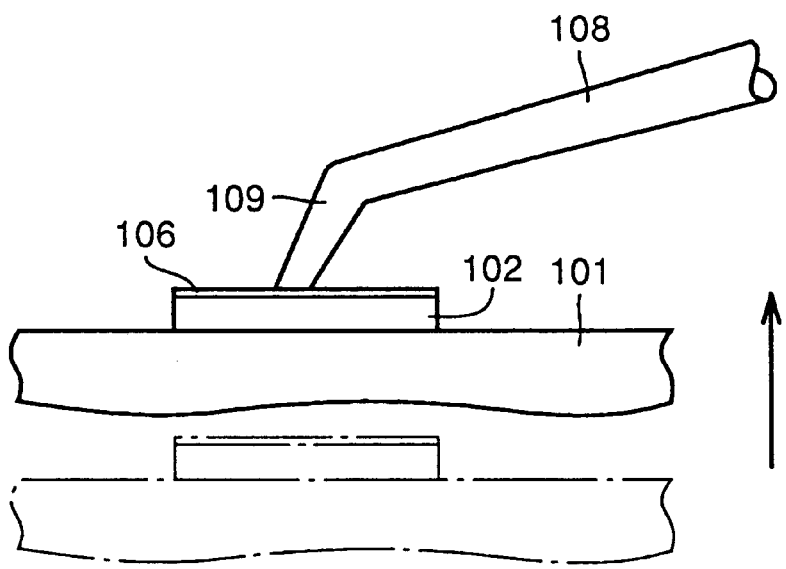
FIGS. 11 and 12 are schematic views for illustrating first and second steps of contact between a probe needle and an electrode of a semiconductor device in inspecting electrical characteristics of the semiconductor device, respectively.
Figure 12:
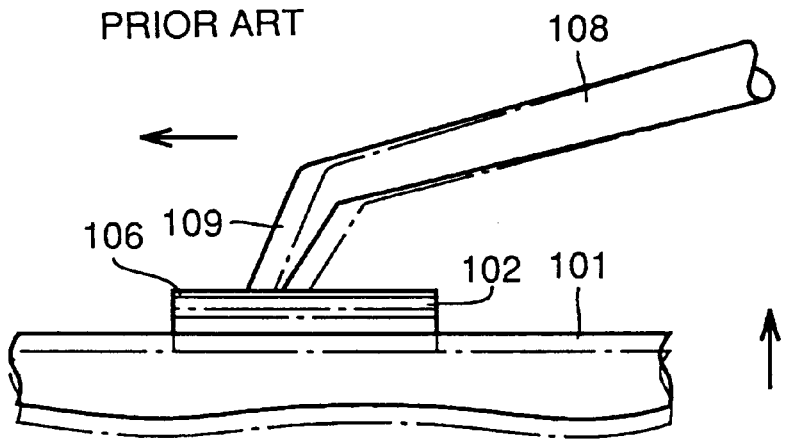

Referring to FIG. 8, $SiO_2$-formed protection film 3 and hole 3$a$ are formed in a similar manner to the first embodiment. A titanium nitride layer is deposited on $SiO_2$-formed protection film 3 by sputtering. A rhenium layer is deposited on the titanium nitride layer by sputtering. Resist is applied to the rhenium layer and patterned into a predetermined shape by photolithography to form a resist pattern 15. The rhenium layer and the titanium nitride layer are patterned according to resist pattern 15 to form rhenium layer 5 and barrier metal layer 8. Resist pattern 15 is then removed. Finally, polyimide protection film 4 and contact hole 7 are formed on silicon substrate 1, as in the first embodiment, to obtain the semiconductor device shown in FIG. 6.

The embodiments of the present invention described above can be varied. For example, the bonding pad electrode can be formed by not only aluminum but also copper, tungsten or the like. Furthermore, a metal layer, such as a bonding pad electrode, may be deposited by not only sputtering but also vapor deposition, ion plating, vapor phase growth or the like. Furthermore, the barrier metal layer can be formed of TiSi, MoSi, WSi or the like.

Furthermore, the shape of the probe needle may be of cartilever type, vertical type, cobra type, L-shaped type or the like. Furthermore, it is needless to say that a similar effect can be obtained if the probe needle is applied as a plunger-type probe needle used in an in-circuit tester or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device with a bonding pad electrode contacting a probe needle of tungsten for electrical conduction, comprising:

a semiconductor substrate;

a tungsten or aluminum bonding pad electrode layer formed on said semiconductor substrate; and a rhenium layer formed on said bonding pad electrode layer.

2. A semiconductor device with a bonding pad electrode contacting a probe needle of tungsten for electrical condition, comprising:

a semiconductor substrate;

a bonding pad electrode layer formed on said semiconductor substrate;

a rhenium layer formed on said bonding pad electrode layer; and a barrier metal layer formed between said bonding pad electrode layer and said rhenium layer.

* * * * *